US012636700B2

(12) United States Patent
Konno et al.

(10) Patent No.: US 12,636,700 B2
(45) Date of Patent: May 26, 2026

(54) CONDUCTIVE COMPOSITION FOR BONDING, BONDING STRUCTURE USING SAME, AND MANUFACTURING METHOD THEREOF

(71) Applicant: MITSUI KINZOKU COMPANY, LIMITED, Tokyo (JP)

(72) Inventors: Satoshi Konno, Ageo (JP); Shinichi Yamauchi, Ageo (JP); Kei Anai, Ageo (JP)

(73) Assignee: MITSUI KINZOKU COMPANY, LIMITED (JP)

( * ) Notice: Subject to any disclaimer, the term of this patent is extended or adjusted under 35 U.S.C. 154(b) by 193 days.

(21) Appl. No.: 18/275,891

(22) PCT Filed: Sep. 6, 2021

(86) PCT No.: PCT/JP2021/032627
§ 371 (c)(1),
(2) Date: Aug. 4, 2023

(87) PCT Pub. No.: WO2022/185571
PCT Pub. Date: Sep. 9, 2022

(65) Prior Publication Data
US 2024/0116104 A1    Apr. 11, 2024

(30) Foreign Application Priority Data
Mar. 4, 2021    (JP) .............................. JP2021-034019

(51) Int. Cl.
| | |
|---|---|
| *B22F 1/00* | (2022.01) |
| *B22F 1/052* | (2022.01) |
| *B22F 1/054* | (2022.01) |
| *B22F 1/10* | (2022.01) |
| *B22F 3/10* | (2006.01) |
| *B22F 7/06* | (2006.01) |
| *B22F 7/08* | (2006.01) |
| *B32B 7/12* | (2006.01) |
| *B32B 9/00* | (2006.01) |
| *B32B 9/04* | (2006.01) |
| *B32B 15/20* | (2006.01) |
| *C09J 9/02* | (2006.01) |
| *C09J 11/04* | (2006.01) |
| *C09J 11/06* | (2006.01) |
| *H01B 1/22* | (2006.01) |

(Continued)

(52) U.S. Cl.
CPC .............. *B22F 1/052* (2022.01); *B22F 1/056* (2022.01); *B22F 1/10* (2022.01); *B22F 3/1007* (2013.01); *B22F 7/064* (2013.01); *B22F 7/08* (2013.01); *B32B 7/12* (2013.01); *B32B 9/007* (2013.01); *B32B 9/04* (2013.01); *B32B 15/20* (2013.01); *C09J 9/02* (2013.01); *C09J 11/04* (2013.01); *C09J 11/06* (2013.01); *H01B 1/22* (2013.01); *B22F 2201/02* (2013.01); *B22F 2301/10* (2013.01); *B22F 2304/05* (2013.01); *B22F 2304/10* (2013.01); *B22F 2998/10* (2013.01); *B22F 2999/00* (2013.01); *B32B 2250/02* (2013.01); *B32B 2255/06* (2013.01); *B32B 2255/26* (2013.01); *B32B 2264/1055* (2020.08); *B32B 2264/302* (2020.08); *B32B 2307/202* (2013.01); *B32B 2457/00* (2013.01); *C09J 2400/16* (2013.01); *H10W 70/417* (2026.01); *H10W 72/073* (2026.01); *H10W 72/07331* (2026.01); *H10W 72/07341* (2026.01); *H10W 72/325* (2026.01); *H10W 72/352* (2026.01); *H10W 72/353* (2026.01); *H10W 72/952* (2026.01)

(58) Field of Classification Search
CPC ............ B22F 1/052; B22F 1/056; B22F 1/10; B22F 3/1007; B22F 7/064; B22F 7/08; B32F 7/12; B32F 9/007; B32F 9/04; B32F 15/20; C09J 9/02; C09J 11/04; C09J 11/06; H01B 1/22; H01L 24/29
USPC ..................................................... 106/287.18
See application file for complete search history.

(56) References Cited

U.S. PATENT DOCUMENTS

2019/0131029 A1    5/2019    Matsuura

FOREIGN PATENT DOCUMENTS

| | | | |
|---|---|---|---|
| JP | 2011143689 A | * 7/2011 | |
| JP | 2017-204371 A | 11/2017 | |
| JP | 2019-87553 A | 6/2019 | |
| JP | 2019087553 A | * 6/2019 | ............. H05K 1/092 |
| JP | 2020-20015 A | 2/2020 | |

(Continued)

OTHER PUBLICATIONS

International Search Report of the International Searching Authority, issued in PCT/JP2021/032627, mailed Nov. 16, 2021; ISA/JP (5 pages).

*Primary Examiner* — James E Mcdonough
(74) *Attorney, Agent, or Firm* — Harness, Dickey & Pierce, P.L.C.

(57) ABSTRACT
A conductive composition for bonding includes a mix of copper powder carboxylic acid. The carboxylic acid has a branched carbon chain. The copper powder comprises first and second copper particles. The first copper particles have a volume-based cumulative particle size $D_{50}$ of 0.11 μm or more and less than 1 μm at a cumulative volume of 50 vol % in a region of particle sizes of less than 1 μm in a particle size distribution of the copper powder. The second copper particles have a volume-based cumulative particle size $D_{50}$ of 1 μm or more and 10 μm or less at a cumulative volume of 50 vol % in a region of particle sizes of 1 μm or more in the particle size distribution of the copper powder. The carboxylic acid is contained in an amount of 6 parts or more and 24 parts or less per 100 parts by mass.

7 Claims, No Drawings

(51) Int. Cl.

| | | |
|---|---|---|
| *H10W 70/40* | (2026.01) |
| *H10W 72/00* | (2026.01) |
| *H10W 72/30* | (2026.01) |
| *H10W 72/90* | (2026.01) |

(56)                    References Cited

FOREIGN PATENT DOCUMENTS

| | | | |
|---|---|---|---|
| JP | 2020-35965 A | | 3/2020 |
| JP | 2020035965 A | * | 3/2020 |
| WO | 03003381 A1 | | 1/2003 |
| WO | 2010/032841 A1 | | 3/2010 |

* cited by examiner

CONDUCTIVE COMPOSITION FOR BONDING, BONDING STRUCTURE USING SAME, AND MANUFACTURING METHOD THEREOF

CROSS REFERENCE TO RELATED APPLICATIONS

This application is a U.S. National Phase application under 35 U.S.C. 371 of International Application No. PCT/JP2021/032627, filed on Sep. 6, 2021, which claims priority to Japanese Patent Application No. 2021-034019, filed on Mar. 4, 2021. The entire disclosures of the above applications are expressly incorporated by reference herein.

BACKGROUND

Technical Field

The present invention relates to a conductive composition for bonding, a bonded structure including the same, and a method for producing the bonded structure.

Related Art

As electronic devices are becoming more compact and more sophisticated, there is an increasing need for improvements in various performance characteristics in forming electronic circuits in the electronic devices, including dimensional stability, conductivity, and bonding strength with members.

WO 2010/032841 discloses a conductive filler that contains a copper filler having an average aggregate particle size of 0.5 to 20 μm, copper nanoparticles having an average aggregate particle size of 50 to 200 nm, and an aliphatic carboxylic acid to improve oxidation resistance, ease of sintering, conductivity, and other characteristics.

JP 2017-204371A discloses a composition for forming a conductor, with the aim of an improvement in the efficiency in production of conductors, and the composition contains 100 parts by mass of copper-containing particles and 0.1 to 5.8 parts by mass of a fatty acid.

When each of the compositions disclosed in WO 2010/032841 and JP 2017-204371A is sintered to be used as a bonding material for bonding conductors to each other, the resulting bonding layer cannot be said to have sufficient conductivity and sufficient bonding strength, and there is room for further improvement. In particular, the technologies disclosed in WO 2010/032841 and JP 2017-204371A fail to provide sufficient bonding strength through pressure-less bonding.

Therefore, the present invention relates to a conductive composition for bonding that can achieve high conductivity and large bonding strength.

SUMMARY

The present invention relates to a conductive composition for bonding, the composition comprising a copper powder and a carboxylic acid mixed therewith,
wherein
the carboxylic acid has a branched carbon chain in its structure,
the copper powder comprises first copper particles and second copper particles, wherein,
the first copper particles have a volume-based cumulative particle size $D_{50}$ of 0.11 μm or more and less than 1 μm at a cumulative volume of 50 vol % in a region of particle sizes of less than 1 μm in a particle size distribution of the copper powder that is determined using a scanning electron microscope, and
the second copper particles have a volume-based cumulative particle size $D_{50}$ of 1 μm or more and 10 μm or less at a cumulative volume of 50 vol % in a region of particle sizes of 1 μm or more in the particle size distribution of the copper powder that is determined using the scanning electron microscope, and
the carboxylic acid is contained in an amount of 6 parts by mass or more and 24 parts by mass or less per 100 parts by mass of the copper powder.

DETAILED DESCRIPTION

Hereinafter, the present invention will be described by way of preferred embodiments thereof. The present invention relates to a composition for bonding electronic component materials such as conductors, or in other words, a conductive composition for bonding. This conductive composition is used to bond electronic component materials to each other without pressure or with pressure, and is preferably suitable for bonding materials without pressure, that is, without applying any pressure other than the atmospheric pressure or the force generated due to the weight of the material to be bonded. Unless otherwise specified, the conductive composition for bonding is hereinafter simply referred to as the conductive composition.

The conductive composition is a mixture obtained by mixing a copper powder and a carboxylic acid. The copper powder contains at least two types of copper particles:first copper particles and second copper particles.

The first copper particles and the second copper particles each are made of a copper element, and contain no elements other than the copper element, except for unavoidable impurities. Namely, the first copper particles and the second copper particles may, each independently, unavoidably contain trace amounts of elements other than the copper element, or unavoidably contain a trace amount of oxygen element as a result of, for example, slight oxidation of the surface of the copper particle, which occurs unavoidably. Usually, the content of the elements other than the copper element in the first copper particles and that in the second copper particles are, each independently, less than 5 mass %. The contents of these elements can be measured using, for example, ICP optical emission spectrometry or an inert gas fusion and non-dispersive infrared absorption method.

The copper powder contained in the conductive composition preferably has at least one peak in a region of particle sizes of 0.11 μm or more and less than 1 μm and at least one peak in a region of particle sizes of 1 μm or more and 10 μm or less, in a volume-weighted particle size distribution determined using a scanning electron microscope.

More specifically, the particle size distribution of the copper powder in the conductive composition is determined using a scanning electron microscope, and divided into two regions: a region of particle sizes of less than 1 μm and a region of particle sizes of 1 μm or more. The volume-based cumulative particle size $D_{50}$ at a cumulative volume of 50 vol % in the former region and that in the latter region are used as the particle size of the first copper particles and that of the second copper particles, respectively.

A specific method for determining the particle sizes is as follows. To a conductive composition as the measurement sample is added a 10-fold amount (by mass) of 2-propanol; the mixture is sufficiently stirred; and then only the supernatant is removed while leaving the solid (cake). This washing process is repeated. Next, the resulting cake is allowed to stand at normal temperature to be sufficiently dried, and the dried product is then examined under a scanning electron microscope.

In the examination under the scanning electron microscope, particles are randomly selected whose contours are visible in scanning electron microscope images of the powder at magnifications of 1,000× to 100,000×; the particle sizes (Heywood diameters) of the selected particles are determined; and the particle size distribution is calculated. Subsequently, the resulting particle size distribution is divided into a region of particle sizes of less than 1 μm and a region of particle sizes of 1 μm or more. The volume-based cumulative particle size $D_{50}$ at a cumulative volume of 50 vol % is determined in the particle size distribution in the region of particle sizes of less than 1 μm and used as the particle size of the first copper particles. Also, the volume-based cumulative particle size $D_{50}$ at a cumulative volume of 50 vol % is determined in the particle size distribution in the region of particle sizes of 1 μm or more and used as the particle size of the second copper particles. The sizes of at least 50 particle are measured in each of the region of less than 1 μm and the region of 1 μm or more to calculate the particle size of the particles as the measurement sample.

In view of preventing aggregation of the first copper particles in the conductive composition to achieve favorable particle dispersibility, the volume-based cumulative particle size $D_{50}$ of the first copper particles at a cumulative volume of 50 vol % in the region of less than 1 μm in the particle size distribution that is determined using the scanning electron microscope is preferably 0.11 μm or more. On the other hand, in view of improving the low-temperature sinterability of the conductive composition, the volume-based cumulative particle size $D_{50}$ of the first copper particles is preferably less than 1 μm, more preferably 0.8 μm or less, even more preferably 0.6 μm or less, and yet even more preferably 0.4 μm or less.

In view of obtaining a dense bonded structure by sintering the conductive composition and also view of facilitating an increase in the bonding strength, the cumulative volume particle size $D_{50}$ of the second copper particles at a cumulative volume of 50 vol % in the region of 1 μm or more in the particle size distribution that is determined using the scanning electron microscope is preferably 1 μm or more. On the other hand, in view of enhancing ease of coating when applying the conductive composition to an electronic component material, the volume-based cumulative particle size $D_{50}$ of the second copper particles is preferably 10 μm or less, more preferably 8 μm or less, and even more preferably 6 μm or less.

There are no particular limitations on the shapes of the first and second copper particles. The shapes of the first and second copper particles may be each independently any of various shapes, including a spherical shape, a flake shape (scale-like shape), a dendrite shape (dendritic shape), and a column shape. In view of improving the packing properties of the particles to achieve sufficient bonding strength even through pressureless bonding, both the first copper particles and the second copper particles are preferably spherical.

Whether or not the copper particles are spherical can be determined as follows. Circularity coefficient $4\pi S/L^2$ is calculated from the area S and the perimeter length L of each of the particles randomly selected according to the above-described method for determining the particle sizes, and the arithmetic mean value of the circularity coefficients is further calculated. It is defined that when the arithmetic mean value of the circularity coefficients is 0.85 or more, the copper particles are spherical.

The percentage of the first copper particles is preferably from 20 to 95 mass %, more preferably from 25 to 90 mass %, and even more preferably from 30 to 80 mass %, based on the total mass of the first and second copper particles in the conductive composition.

The percentage of the second copper particles is preferably from 5 to 80 mass %, more preferably from 10 to 75 mass %, and even more preferably from 20 to 70 mass %, based on the total mass of the first and second copper particles.

Such mixing percentages enable improvement in the packing properties of particles, so that sufficient bonding strength can be achieved even through pressureless bonding.

The conductive composition contains a carboxylic acid. Carboxylic acids are organic acids that are liquid or solid at 1 atm and 20° C. Since the conductive composition contains a carboxylic acid, the surface of each copper particle composing the copper powder is etched, so that an oxide layer and a hydroxide layer unavoidably formed on the particle surface are removed to expose metallic copper; thus, the particle surface can be activated. Also, copper carboxylate is generated by a chemical reaction between copper from the copper particles and the carboxylic acid, and the copper carboxylate can promote sintering of the copper particles. As a result, a bonding layer obtained by sintering the conductive composition can exhibit sufficient conductivity of metallic copper and can also achieve sufficient bonding strength even through pressureless bonding.

The carboxylic acid contained in the conductive composition may be an aliphatic or aromatic carboxylic acid having a linear carbon chain or a branched carbon chain (hereinafter also referred to simply as a branched chain).

Of these carboxylic acids, an aliphatic carboxylic acid having a branched chain is preferable as the carboxylic acid contained in the conductive composition. When the carboxylic acid is an aliphatic carboxylic acid having a branched chain, the steric hindrance caused by the branched chain of the carboxylic acid allows the copper particles to be kept at an appropriate distance from each other. As a result, the dispersibility of particles in the conductive composition is improved, and the printability of the composition is also improved.

The carboxylic acid contained in the conductive composition may be a primary, secondary, or a tertiary carboxylic acid having a branched chain, preferably a secondary or tertiary carboxylic acid having a branched chain, and more preferably a tertiary carboxylic acid having a branched chain.

When such a carboxylic acid is used, appropriate dispersibility of the particles can be maintained due to the bulkiness of the molecular structure of the carboxylic acid, and favorable handleability of the conductive composition can be thus obtained. In addition, the sinterability of the conductive composition can be sufficiently improved, so that a bonding layer that has a high level of conductivity and also provides a high level of bonding strength between other members can be easily obtained.

The carboxylic acid may be monovalent or polyvalent. The carboxylic acid may be a saturated carboxylic acid or an unsaturated carboxylic acid.

In view of improving the handleability, the carboxylic acid contained in the conductive composition preferably has 4 to 18 carbon atoms, more preferably 5 to 15 carbon atoms, and even more preferably 6 to 13 carbon atoms.

More specifically, examples of a carboxylic acid suitable for the present invention include one or more of the following carboxylic acids: saturated and branched aliphatic mono-carboxylic acids such as isobutyric acid, pivalic acid, 2,2-methylbutyric acid, isopentanoic acid, isohexanoic acid, isoheptanoic acid, isooctanoic acid, isononanoic acid, iso-decanoic acid, neodecanoic acid, isotridecanoic acid, isotet-radecanoic acid, isopalmitic acid, and isostearic acid; unsaturated and branched aliphatic monocarboxylic acids such as methacrylic acid; and unsaturated tricarboxylic acids such as aconitic acid. These carboxylic acids may be used singly or in combination.

It is preferable to use a carboxylic acid that is liquid at 1 atm and 20° C. When such a carboxylic acid is used, the carboxylic acid itself also functions as a dispersion medium, and thus, a conductive composition containing the copper particles uniformly dispersed can be obtained with high productivity without the need to use an additional dispersion medium, which will be described later. Furthermore, the copper particles can be easily dispersed and kept in the dispersed state without the need to use other volatile com-ponents, such as a dispersion medium, which may otherwise cause void formation through sintering, and thus, a bonding layer that has improved conductivity and also provides large bonding strength between other members can be easily obtained.

Examples of the carboxylic acid that is liquid at 1 atm and 20° C. include saturated and branched aliphatic monocar-boxylic acids having 4 to 18 carbon atoms.

In view of obtaining a conductive composition that has a high level of conductivity and also has a high level of bonding strength, a tertiary saturated aliphatic monocarbox-ylic acid that is liquid at 1 atm and 20° C. is more preferable. Examples of such a carboxylic acid include 2,2-dimethyl-butyric acid and neodecanoic acid, and neodecanoic acid is particularly preferable. When such a carboxylic acid is used in the conductive composition, an even higher bonding strength can be achieved even through pressureless bonding.

The carboxylic acid content in the conductive composi-tion is preferably from 6 to 24 parts by mass, and more preferably from 6 to 20 parts by mass, per 100 parts by mass of copper powder. The carboxylic acid content within this range can impart favorable dispersibility to the particles in the resulting conductive composition and also favorable printability to the composition, and can also bring about large bonding strength when the composition is used to form a bonded structure. In the case where two or more carboxylic acids are contained, the total amount of the carboxylic acids may be within the above-described range of the carboxylic acid content.

The above-described conductive composition may be in the form of a conductive slurry, a conductive ink, or a conductive paste, for example.

In the case where the carboxylic acid contained in the conductive composition is a carboxylic acid that is solid at 1 atm and 20° C., it is preferable that the conductive composition further contains a dispersion medium, in view of improving uniform dispersibility of the copper particles and the carboxylic acid and improving dispersibility of the copper particles.

Examples of the dispersion medium used in the conduc-tive composition include water, alcohols, ketones, esters, ethers, and hydrocarbons, and also binder resins. Examples of the binder resins include at least one of an acrylic resin, an epoxy resin, a polyester resin, a polycarbonate resin, and a cellulose resin.

Among these dispersion media, at least one of the fol-lowing is preferred: alcohols such as propylene glycol, ethylene glycol, hexylene glycol, diethylene glycol, 1,3-butanediol, 1,4-butanediol, dipropylene glycol, tripropylene glycol, terpineol, and dihydroterpineol; and ethers such as ethyl carbitol and butyl carbitol.

In the case where the conductive composition further contains the dispersion medium, the dispersion medium content in the conductive composition is preferably 20 parts by mass or less, more preferably 15 parts by mass or less, and even more preferably 10 parts by mass or less, per 100 parts by mass of copper powder. The dispersion medium content within this range can reduce voids that otherwise form during sintering of the conductive composition and improve the packing properties, to thereby increase the bonding strength when the composition is used to form a bonded structure.

It is also preferable that the conductive composition should further contain a sintering aid for the purpose of obtaining a dense bonding layer by improving the packing properties of the conductive composition or the purpose of preventing unintentional oxidation of the copper particles during sintering by a high reducing effect of the sintering aid. The sintering aids may be used singly or in combination.

Examples of the sintering aid for improving the packing properties of the conductive composition include inorganic materials such as borosilicate glass, barium borosilicate glass, and zinc borosilicate glass.

Examples of the sintering aid exhibiting a high reducing effect include polyethers such as polyethylene glycol and polypropylene glycol. These polyethers are excluded from the above-described dispersion medium. In the case where polyethylene glycol is used among the organic polymer compounds listed above, the number average molecular weight thereof is preferably 120 or more and 400 or less, or more preferably 180 or more and 400 or less.

In the case where the conductive composition further contains the sintering aid, the sintering aid content in the conductive composition is preferably 20 parts by mass or less, more preferably 15 parts by mass or less, and even more preferably 10 parts by mass or less, per 100 parts by mass of the copper powder. In the case where two or more sintering aids are contained, the total amount of the sinter-ing aids may be within the above-described range of the sinter-ing aid content. The sintering aid content within this range can prevent a reduction in the bonding strength of a bonded structure when the conductive composition is sintered.

The above-described copper particles may not be sub-jected to any special surface treatment. Alternatively, the copper particles constituting the copper powder may be coated or surface-treated with an organic or inorganic sub-stance as long as the effects of the present invention can be exhibited.

Next, a preferred method for producing the conductive composition will be described. The method involves uses of first copper particles, second copper particles, and a carbox-ylic acid, and includes the step of producing the first copper particles and the second copper particles separately, and the step of mixing the first copper particles, the second copper particles, and the carboxylic acid, as well as a dispersion medium and a sintering aid that may be used if necessary, simultaneously, or combining and mixing these components in any desired order. To mix the components, a known mixing apparatus such as a roll mill can be used.

The method for producing the copper particles can be any of various methods such as a wet reduction method, an atomizing method, and an electrolytic reduction method. Spherical particles are likely to be obtained when a wet reduction method or an atomizing method is employed. Dendrite-shaped or column-shaped particles are likely to be obtained when an electrolytic reduction method is employed. Flake-shaped particles can be obtained by, for example, applying a mechanical external force to spherical particles to plastically deform the spherical particles.

In view of achieving both of the ease of particle size control and the ease of obtaining spherical particles, each of the first copper particles and the second copper particles are preferably produced using a wet reduction method. Examples of the wet reduction method can be found in JP 2003-34802A, JP 2015-168878A, and JP 2017-179555A.

The wet reduction method can be carried out in the following manner, for example. A reaction solution is prepared that contains a monovalent or divalent copper source, such as copper chloride, copper acetate, copper hydroxide, copper sulfate, copper oxide, or cuprous oxide, and a liquid medium containing water and a monohydric alcohol preferably having 1 to 5 carbon atoms. Hydrazine is mixed with this reaction solution preferably in a ratio such that the amount of hydrazine is 0.5 mol or more and 50 mol or less per 1 mol of copper to reduce copper ions derived from the copper source, thereby obtaining intended first or second copper particles. The obtained copper particles may be washed using a washing method such as decantation or rotary filtering, if necessary. The copper particles obtained in the above-described manner is either a slurry containing a particle assemblage or a dry powder consisting of the assemblage. The obtained copper particles may be further subjected to the surface treatment or coating treatment as described above.

In order to control the average primary particle size of copper particles in the wet reduction method, the copper ion concentration of the reaction solution, the temperature of the reaction solution, and other conditions can be changed, for example, and the average primary particle size can be thus easily adjusted. Thus, the first copper particles and the second copper particles, which have different particle sizes, can be obtained. Then, the first copper particles and the second copper particles can be mixed such that a copper powder to be obtained has the above-described particle size distribution and mixing ratio by mass.

In view of ease of obtaining a desired particle size distribution of the copper powder in the resulting conductive composition and desired particle sizes of the first copper particles and the second copper particles, the average primary particle size of the first copper particles used to produce the conductive composition is preferably 0.11 μm or more and less than 1 μm, and more preferably from 0.11 to 0.8 μm.

From the same viewpoint, the average primary particle size of the second copper particles used to produce the conductive composition is preferably from 1 to 10 μm, and more preferably from 1 to 8 μm.

The average primary particle sizes of the first copper particles and the second copper particles used to produce the conductive compositions are each determined by, for example, randomly selecting 50 or more particles that do not overlap each other in scanning electron microscope images of the copper particles at magnifications of 1,000× to 100,000×, measuring the particle sizes (Heywood diameters) of the selected particles, and calculating a spherical-equivalent mean volume diameter from these found values.

The conductive composition obtained through the above-described process may be, for example, applied to the surface of an object to be coated, using a predetermined means, to form a coating film, which may then be heated without pressure or with pressure to obtain a conductive film.

The conductive composition of the present invention is suitably used as a conductive bonding material for bonding electronic component materials, such as various conductors, to each other, and examples thereof include a die bonding material. The conductive composition of the present invention can also be used as a material for filling a via in a printed wiring board, or as an adhesive for surface-mounting an electronic device on a printed wiring board. In particular, the conductive composition of the present invention can achieve sufficient bonding strength in pressureless bonding.

Preferred examples of electronic component materials to be bonded include conductors, and examples of the conductors include spacers, heat sinks, and metal wires made of various conductive metals such as gold, silver, or copper; substrates having such metals on their surfaces; and semiconductor chips.

Now, an exemplary method for bonding conductors to each other with the conductive composition as a bonding material will be described below. The method includes the step of interposing the conductive composition between two conductors and the step of sintering the conductive composition for bonding.

First, the conductive composition is applied to the surface of the first conductor to form a coating film. There is no particular limitation on the means to apply the composition for bonding, and any known application means can be used. The coating film may be formed on the entire region of the surface of the first conductor, or may be discontinuously formed on the surface of the first conductor. In view of achieving larger bonding strength, it is preferable that the coating film should be formed on the entire region where the second conductor, which will be described later, is to be disposed.

In view of forming a bonded structure having stable large bonding strength, the thickness of the coating film to be formed is preferably 1 μm or more and 500 μm or less, and more preferably 5 μm or more and 300 μm or less, immediately after the application.

Subsequently, the second conductor is placed on the coating film. Thus, a conductive member composed of the first conductor and the second conductor with the coating film of the conductive composition interposed therebetween is obtained.

The first conductor and the second conductor may be made of the same type of material or different types of materials.

Lastly, the conductive member is subjected to heating treatment without pressure or with pressure to thereby heat the coating film to sinter the copper powder contained in the coating film, whereby the first conductor and the second conductor are bonded together. In this manner, a conductive bonded structure having a bonding portion derived from the conductive composition can be obtained.

During the sintering, the atmosphere is preferably a reducing gas atmosphere such as hydrogen or formic acid, or an inert gas atmosphere such as nitrogen or argon. The sintering temperature is preferably below 300° C., more preferably 150° C. or above and below 300° C., even more preferably 200° C. or above and below 300° C., and yet even more preferably 230° C. or above and below 300° C.

The sintering time is preferably 20 minutes or longer, more preferably from 20 to 60 minutes, and even more preferably from 30 to 60 minutes, when the sintering temperature is within the above-described range.

The pressure, if applied during the sintering, is preferably 0.001 MPa or higher, more preferably from 0.001 to 20 MPa, and even more preferably from 0.01 to 15 MPa.

An inert gas atmosphere at the above-described sintering temperature is a mild condition for sintering, and under such a condition, it is difficult for a conventional technology to achieve favorable progress in sintering of particles and also to provide sufficient bonding strength. In addition, pressureless bonding is unlikely to achieve sufficient melting of the copper particles and sufficient formation of necking between the particles, resulting in insufficient bonding strength or high likelihood of formation of voids in the resulting sintered body.

In these regards, use of the conductive composition of the present invention enables favorable progress of sintering of the copper particles to thereby achieve large bonding strength even under the mild sintering conditions as described above. The reason of this is that the presence of the carboxylic acid having a branched chain brings about good dispersibility of the copper particles and also the surface activity of the copper particles that is maintained at a high level. In addition, even when pressureless bonding is performed, the second copper particles, which have a larger particle size, function like an aggregate and the first copper particles, which have a smaller particle size, function like a filler to fill gaps between the copper particles, which result in the improved packing properties. Accordingly, a sintered body to be obtained has a dense structure with less voids and therefore large bonding strength. Also, a coating film with a uniform thickness can be obtained, and thus, unintentional tilting of a bonding target object and defective bonding are unlikely to occur. In addition to these, pressureless bonding advantageously enables the bonding of a plurality of bonding target objects with different heights at the same time, and also enables elimination of the need to provide a pressure-applying apparatus to thereby achieve a reduction in the production cost.

Furthermore, in the case where the conductive composition contains no dispersion medium, void formation caused by a volatile component derived from a dispersion medium can be reduced additionally. This advantageously achieves even larger bonding strength while the sintering progresses well.

The bonding portion formed through the above-described process is due to the sintering of the conductive composition. More specifically, the bonding portion is a sintered body of copper particles constituting the conductive composition, and is conductive.

By taking advantage of the characteristics of the bonding portion, for example, the large bonding strength and conductivity, a bonded structure having such a bonding portion can be suitably used in various electronic circuits, electronic circuits for use in environments in high temperatures, such as an in-vehicle electronic circuit, and electronic circuits with a power device mounted thereon.

EXAMPLES

Hereinafter, the present invention will be described in further detail by way of examples. However, the scope of the present invention is not limited to these examples. In a table below, "-" in a field indicates "not contained" or "not evaluated". The term "average primary particle size" used hereinbelow means the particle size of copper particles used as a material, as measured according to the above-described method. The inventors of the present invention confirmed that the value thereof was the same as the cumulative volume particle size $D_{50}$ of the copper particles when the copper particles were incorporated into a conductive composition.

Example 1

As a copper powder to be used, spherical first copper particles with an average primary particle size of 0.14 μm (CH-0200L1, manufactured by Mitsui Mining & Smelting Co., Ltd.) and spherical second copper particles with an average primary particle size of 2.2 μm (CS20, manufactured by Mitsui Mining & Smelting Co., Ltd.) were mixed in a mass ratio of first copper particles:second copper particles=90:10. As a carboxylic acid, neodecanoic acid (Versatic 10, manufactured by Hexion; a saturated and branched C10 tertiary aliphatic monocarboxylic acid that is liquid at 1 atm and 20° C.) was used.

To 100 parts by mass of the copper powder was added 12.99 parts by mass of neodecanoic acid, and the mixture was preliminarily kneaded with a spatula. Then, using a planetary vacuum mixer ARE-500, manufactured by Thinky Corporation, the kneaded product was made into a paste by two mixing cycles, one mixing cycle consisting of an agitation mode (1,000 rpm×1 minute) and a defoaming mode (2,000 rpm×30 seconds). A further processing operation for dispersing and mixing was conducted on the paste using a three-roll mill, to thereby obtain a conductive composition for bonding in a paste form.

Example 2

To the conductive composition prepared in Example 1, a sintering aid (polyethylene glycol 300 (PEG300)) was further added in an amount of 1 part by mass per 100 parts by mass of the copper powder. Using the planetary vacuum mixer ARE-500, manufactured by Thinky Corporation, one mixing cycle consisting of the agitation mode (1,000 rpm×1 minute) and the defoaming mode (2,000 rpm×30 seconds) was performed, to thereby obtain a conductive composition of Example 2 in a paste form.

Example 3

A mixture was preliminarily kneaded, the kneaded product was made into a paste, and a further processing operation for dispersing and mixing was conducted on the paste, in the same manner as in Example 1, to thereby obtain a conductive composition for bonding in a paste form, except that the mass ratio between the first copper particles and the second copper particles was changed to first copper particles:second copper particles=70:30, and that the amount of neodecanoic acid added was changed to 11.11 parts by mass per 100 parts by mass of the copper powder.

Example 4

To the conductive composition prepared in Example 3, a sintering aid (polyethylene glycol 300 (PEG300)) was further added in an amount of 1 part by mass per 100 parts by mass of the copper powder. Using the planetary vacuum mixer ARE-500, manufactured by Thinky Corporation, one mixing cycle consisting of the agitation mode (1,000 rpm×1 minute) and the defoaming mode (2,000 rpm×30 seconds) was performed, to thereby obtain a conductive composition of Example 3 in a paste form.

Example 5

A mixture was preliminarily kneaded, the kneaded product was made into a paste, and a further processing operation for dispersing and mixing was conducted on the paste, in the same manner as in Example 1, to thereby obtain a conductive composition for bonding in a paste form, except that the mass ratio between the first copper particles and the second copper particles was changed to first copper particles:second copper particles=50:50, and that the amount of neodecanoic acid added was changed to 11.11 parts by mass per 100 parts by mass of the copper powder.

Example 6

To the conductive composition prepared in Example 5, a sintering aid (polyethylene glycol 300 (PEG300)) was further added tin an amount of 1 part by mass per 100 parts by mass of the copper powder. Using the planetary vacuum mixer ARE-500, manufactured by Thinky Corporation, one mixing cycle consisting of the agitation mode (1,000 rpm×1 minute) and the defoaming mode (2,000 rpm×30 seconds) was performed, to thereby obtain a conductive composition for bonding of Example 6 in a paste form.

Example 7

A mixture was preliminarily kneaded, the kneaded product was made into a paste, and a further processing operation for dispersing and mixing was conducted on the paste, in the same manner as in Example 1, to thereby obtain a conductive composition for bonding in a paste form, except that the mass ratio between the first copper particles and the second copper particles was changed to first copper particles:second copper particles=30:70, and that the amount of neodecanoic acid added was changed to 8.11 parts by mass per 100 parts by mass of the copper powder.

Example 8

To the conductive composition prepared in Example 7, a sintering aid (polyethylene glycol 300 (PEG300)) was further added in an amount of 1 part by mass per 100 parts by mass of the copper powder. Using the planetary vacuum mixer, ARE-500, manufactured by Thinky Corporation, one mixing cycle consisting of the agitation mode (1,000 rpm×1 minute) and the defoaming mode (2,000 rpm×30 seconds) was performed, to thereby obtain a conductive composition for bonding of Example 8 in a paste form.

Comparative Example 1

A mixture was preliminarily kneaded, the kneaded product was made into a paste, and a further processing operation for dispersing and mixing was conducted on the paste, in the same manner as in Example 3, to thereby obtain a conductive composition for bonding in a paste form, except that the mass ratio between the first copper particles and the second copper particles was changed to first copper particles:second copper particles=10:90.

Comparative Example 2

A mixture was preliminarily kneaded, the kneaded product was made into a paste, and a further processing operation for dispersing and mixing was conducted on the paste, in the same manner as in Example 4, to thereby obtain a conductive composition for bonding in a paste form, except that the mass ratio between the first copper particles and the second copper particles was changed to first copper particles:second copper particles=10:90.

Comparative Example 3

A mixture was preliminarily kneaded, the kneaded product was made into a paste, and a further processing operation for dispersing and mixing was conducted on the paste, in the same manner as in Example 1, to thereby obtain a conductive composition for bonding in a paste form, except for the following: no carboxylic acid was used; the mass ratio between the first copper particles and the second copper particles was changed to first copper particles:second copper particles=50:50; and terpineol as a dispersion medium was added in an amount of 11.11 parts by mass per 100 parts by mass of the copper powder.

Comparative Example 4

To the conductive composition prepared in Comparative Example 3, a sintering aid (polyethylene glycol 300 (PEG300)) was further added in an amount of 1 part by mass per 100 parts by mass of the copper powder. Using the planetary vacuum mixer ARE-500, manufactured by Thinky Corporation, one mixing cycle consisting of the agitation mode (1,000 rpm×1 minute) and the defoaming mode (2,000 rpm×30 seconds) was performed, to thereby obtain a conductive composition of Comparative Example 4 in a paste form.

Comparative Example 5

A conductive composition in a paste form was prepared in the same manner as in Example 5, except that decanoic acid (a primary saturated C10 carboxylic acid having a linear carbon chain, manufactured by FUJIFILM Wako Pure Chemical Corporation) as the carboxylic acid was added in an amount of 11.11 parts by mass per 100 parts by mass of the copper powder, and that terpineol as a dispersion medium was added in an amount of 7.41 parts by mass per 100 parts by mass of the copper powder.

Examples 9 to 11 and Comparative Example 6

A mixture was preliminarily kneaded, the kneaded product was made into a paste, and a further processing operation for dispersing and mixing was conducted on the paste, in the same manner as in Example 5, to thereby obtain a conductive composition for bonding in a paste form, except that the amount of neodecanoic acid added was changed to the amount shown in Table 1 below per 100 parts by mass of the copper powder.

Example 12

A mixture was preliminarily kneaded, the kneaded product was made into a paste, and a further processing operation for dispersing and mixing was conducted on the paste, in the same manner as in Example 5, to thereby obtain a conductive composition for bonding in a paste form, except that spherical first copper particles with an average primary particle size of 0.16 μm (CH-0200, manufactured by Mitsui Mining & Smelting Co., Ltd.) were used instead of the first copper particles used in Example 5.

Example 13

To the conductive composition prepared in Example 12, a sintering aid (polyethylene glycol 300 (PEG300)) was further added in an amount of 1 part by mass per 100 parts by mass of the copper powder. Using the planetary vacuum mixer ARE-500, manufactured by Thinky Corporation, one mixing cycle consisting of the agitation mode (1,000 rpm×1 minute) and the defoaming mode (2,000 rpm×30 seconds) was performed, to thereby obtain a conductive composition of Example 13 in a paste form.

Comparative Example 7

A mixture was preliminarily kneaded, the kneaded product was made into a paste, and a further processing operation for dispersing and mixing was conducted on the paste, in the same manner as in Example 12, to thereby obtain a conductive composition for bonding in a paste form, except for the following: no carboxylic acid was used; the mass ratio between the first copper particles and the second copper particles was changed to first copper particles:second copper particles=50:50; and terpineol as a dispersion medium was added in an amount of 11.11 parts by mass per 100 parts by mass of the copper powder.

Comparative Example 8

To the conductive composition prepared in Comparative Example 7, a sintering aid (polyethylene glycol 300 (PEG300)) was further added in an amount of 1 part by mass per 100 parts by mass of the copper powder. Using the planetary vacuum mixer ARE-500, manufactured by Thinky Corporation, one mixing cycle consisting of the agitation mode (1,000 rpm×1 minute) and the defoaming mode (2,000 rpm×30 seconds) was performed, to thereby obtain a conductive composition of Comparative Example 8 in a paste form.

Evaluation of Conductivity

Each of the conductive compositions of Examples and Comparative Examples was applied to an area with dimensions of 10 mm×20 mm on a glass plate and then sintered at 260° C. for 30 minutes to produce a conductive film, i.e., a sintered body of the conductive composition. The specific resistance (μΩ·cm) of this conductive film was measured using a four-probe specific resistance meter Loresta MCP-T600, manufactured by Mitsubishi Analytech. Since the conductive composition of Comparative Example 5 solidified over time, printing therewith onto a glass plate was not possible, and therefore the composition of Comparative Example 5 was not evaluated for its conductivity. Table 1 below shows the results.

Evaluation of Bonding Strength

Each of the conductive compositions of Examples or Comparative Examples was applied, by screen printing, to a portion of a copper lead frame (2.0 mm in thickness) to form a coating film. The portion was the area where a chip was to be mounted, and the coating film had a size of 5 mm square and a thickness of 100 μm.

Next, a 2 mm square SiC chip (0.37 mm in thickness) was placed on the coating film, and the thickness of the coating film was adjusted to 50 μm using a Digimatic Indicator (manufactured by Mitutoyo Corporation). Then, sintering was performed at 260° C. for 30 minutes in a nitrogen atmosphere to produce a bonded structure in which a sintered body of the conductive composition was formed between the copper plate and the SiC chip.

The breaking strength of the bonded structure obtained in the above-described manner was measured. A bond tester, Condor Sigma, manufactured by XYZTEC was used for the measurement. The breaking strength (MPa) is defined as breaking load (N)/bonded area (mm 2). Since the conductive composition of Comparative Example 5 solidified as described above, it was not evaluated for bonding strength. Table 1 below shows the results.

TABLE 1

| | Carboxylic acid | | Sintering aid | | Evaluation of conductivity | Evaluation of |
| | Type | Amount (parts by mass per 100 parts by mass of copper powder) | Type | Amount (parts by mass per 100 parts by mass of copper powder) | Specific resistance [μΩ · cm] | bonding strength Breaking strength [MPa] |
|---|---|---|---|---|---|---|
| Ex. 1 | Neodecanoic acid | 12.99 | — | — | 17 | 16.1 |
| Ex. 2 | Neodecanoic acid | 12.99 | Polyethylene glycol | 1 | 21 | 11.5 |
| Ex. 3 | Neodecanoic acid | 11.11 | — | — | 13 | 12.4 |
| Ex. 4 | Neodecanoic acid | 11.11 | Polyethylene glycol | 1 | 15 | 17.8 |
| Ex. 5 | Neodecanoic acid | 11.11 | — | — | 13 | 15.9 |
| Ex. 6 | Neodecanoic acid | 11.11 | Polyethylene glycol | 1 | 12 | 30.0 |
| Ex. 7 | Neodecanoic acid | 8.11 | — | — | 14 | 12.0 |
| Ex. 8 | Neodecanoic acid | 8.11 | Polyethylene glycol | 1 | 16 | 18.0 |
| Ex. 9 | Neodecanoic acid | 13 | — | — | 17 | 22.2 |
| Ex. 10 | Neodecanoic acid | 19 | — | — | 16 | 26.3 |
| Ex. 11 | Neodecanoic acid | 22 | — | — | 18 | 14.4 |
| Ex. 12 | Neodecanoic acid | 11.11 | — | — | 14 | 10.4 |
| Ex. 13 | Neodecanoic acid | 11.11 | Polyethylene glycol | 1 | 12 | 13.4 |
| Com. Ex.1 | Neodecanoic acid | 11.11 | — | — | 9 | 0.9 |
| Com. Ex.2 | Neodecanoic acid | 11.11 | Polyethylene glycol | 1 | 9 | 3.7 |

TABLE 1-continued

| | Carboxylic acid | | Sintering aid | | Evaluation of conductivity | Evaluation of |
| | Type | Amount (parts by mass per 100 parts by mass of copper powder) | Type | Amount (parts by mass per 100 parts by mass of copper powder) | Specific resistance [μΩ · cm] | bonding strength Breaking strength [MPa] |
|---|---|---|---|---|---|---|
| Com. Ex.3 | — | — | — | — | 8 | 2.0 |
| Com. Ex.4 | — | — | Polyethylene glycol | 1 | 10 | 6.1 |
| Com. Ex.5 | Decanoic acid | 11.11 | — | — | — | — |
| Com. Ex.6 | Neodecanoic acid | 25 | — | — | 15 | 7.5 |
| Com. Ex.7 | — | — | — | — | 12 | 2.2 |
| Com. Ex.8 | — | — | Polyethylene glycol | 1 | 10 | 4.7 |

INDUSTRIAL APPLICABILITY

According to the present invention, a conductive composition for bonding that can achieve high conductivity and large bonding strength is provided.

The invention claimed is:

1. A conductive composition for bonding, comprising a copper powder and a carboxylic acid mixed therewith, wherein the carboxylic acid has a branched carbon chain in its structure, the copper powder comprises first copper particles and second copper particles, a percentage of the first copper particles being 30 to 95 mass % relative to a total mass of the first and second copper particles, wherein, the first copper particles have a volume-based cumulative particle size $D_{50}$ of 0.11 μm or more and less than 1 μm at a cumulative volume of 50 vol % in a region of particle sizes of less than 1 μm in a particle size distribution of the copper powder that is determined using a scanning electron microscope, and the second copper particles have a volume-based cumulative particle size $D_{50}$ of 1 μm or more and 10 μm or less at a cumulative volume of 50 vol % in a region of particle sizes of 1 μm or more in the particle size distribution of the copper powder that is determined using the scanning electron microscope, and the carboxylic acid is contained in an amount of 6 parts by mass or more and 24 parts by mass or less per 100 parts by mass of the copper powder.

2. The conductive composition for bonding as set forth in claim 1, wherein the carboxylic acid is an aliphatic monovalent carboxylic acid having 4 to 18 carbon atoms.

3. The conductive composition for bonding as set forth in claim 1, wherein the carboxylic acid is a tertiary carboxylic acid.

4. The conductive composition for bonding as set forth in claim 1, wherein the carboxylic acid is liquid at 1 atm and 20° C.

5. The conductive composition for bonding as set forth in claim 1, wherein the carboxylic acid is neodecanoic acid.

6. A bonded structure comprising a first conductor, a second conductor, and a bonding portion with which the first conductor and the second conductor are bonded to each other, wherein the bonding portion comprises a sintered body of the conductive composition for bonding as set forth in claim 1.

7. A method for producing a bonded structure, comprising a step of interposing the conductive composition for bonding as set forth in claim 1 between two conductors, and a step of sintering the conductive composition for bonding.

* * * * *